(12) United States Patent
Choi

(10) Patent No.: US 11,201,149 B2
(45) Date of Patent: Dec. 14, 2021

(54) SEMICONDUCTOR DEVICES

(71) Applicant: SK hynix Inc., Icheon-si (KR)

(72) Inventor: Sun Myung Choi, Seoul (KR)

(73) Assignee: SK hynix Inc., Icheon-si (KR)

( * ) Notice: Subject to any disclaimer, the term of this patent is extended or adjusted under 35 U.S.C. 154(b) by 36 days.

(21) Appl. No.: 16/829,598

(22) Filed: Mar. 25, 2020

(65) Prior Publication Data

US 2021/0074700 A1    Mar. 11, 2021

(30) Foreign Application Priority Data

Sep. 6, 2019    (KR) .......................... 10-2019-0111075

(51) Int. Cl.
| | | |
|---|---|---|
| *G11C 7/10* | (2006.01) | |
| *H01L 27/06* | (2006.01) | |
| *H01L 25/065* | (2006.01) | |
| *H01L 23/538* | (2006.01) | |
| *G11C 8/12* | (2006.01) | |
| *G11C 5/02* | (2006.01) | |
| *G11C 5/06* | (2006.01) | |

(52) U.S. Cl.
CPC .......... *H01L 27/0688* (2013.01); *G11C 5/025* (2013.01); *G11C 5/063* (2013.01); *G11C 7/10* (2013.01); *G11C 7/1006* (2013.01); *G11C 7/109* (2013.01); *G11C 7/1087* (2013.01); *G11C 8/12* (2013.01); *H01L 23/5384* (2013.01); *H01L 23/5385* (2013.01); *H01L 25/0657* (2013.01)

(58) Field of Classification Search
CPC ............. H01L 27/0688; H01L 25/0657; H01L 23/5385; H01L 23/5384; G11C 5/063; G11C 5/025; G11C 8/12; G11C 7/109; G11C 7/1087; G11C 7/1006; G11C 7/10; G11C 7/222; G11C 5/04; G11C 5/06; G11C 7/1078
USPC ....................................... 365/189.011, 189.05
See application file for complete search history.

(56) References Cited

U.S. PATENT DOCUMENTS

2004/0141609 A1*   7/2004  Shi ....................... H04L 12/5601
                                                     379/413.02
2005/0198373 A1*   9/2005  Saunderson .......... H04L 12/423
                                                     709/238

(Continued)

FOREIGN PATENT DOCUMENTS

KR    1020140120033 A    10/2014
KR    1020160068532 A     6/2016

*Primary Examiner* — Michael T Tran
(74) *Attorney, Agent, or Firm* — William Park & Associates Ltd.

(57) ABSTRACT

A semiconductor device includes a master chip and a first slave chip. The master chip outputs a write signal or read signal and a chip identification (ID) signal and outputs data through a transmitter activated by the write signal or receives data through a receiver activated by the read signal. The first slave chip enters a write operation according to the write signal and activates a first receiver to store the data when the chip ID signal has a first logic level combination. The first slave chip enters a read operation according to the read signal and configured to activate a first transmitter to output the data when the chip ID signal has a first logic level combination. The master chip and the first slave chip are vertically stacked and are electrically connected to each other by a plurality of through electrodes penetrating the first slave chip.

35 Claims, 10 Drawing Sheets

(56) References Cited

U.S. PATENT DOCUMENTS

| | | | |
|---|---|---|---|
| 2005/0207213 A1* | 9/2005 | Cernea | G11C 16/26 365/154 |
| 2005/0273539 A1* | 12/2005 | Yamamoto | G06F 13/4256 710/110 |
| 2009/0089469 A1* | 4/2009 | Zeng | G01R 31/2868 710/110 |
| 2012/0215955 A1* | 8/2012 | Yun | G06F 13/1657 710/110 |
| 2013/0151829 A1* | 6/2013 | Amann | G06F 9/4401 713/2 |
| 2014/0241414 A1* | 8/2014 | Reidl | H04L 25/4904 375/238 |
| 2014/0292744 A1* | 10/2014 | Sugimoto | G09G 3/20 345/213 |
| 2014/0355370 A1* | 12/2014 | Kim | G11C 29/028 365/222 |
| 2014/0376613 A1* | 12/2014 | Sekiguchi | H04N 9/7921 375/240.02 |
| 2016/0019173 A1* | 1/2016 | Liu | G06F 13/4022 710/110 |
| 2016/0162217 A1* | 6/2016 | Song | G06F 3/0604 711/118 |
| 2016/0224489 A1* | 8/2016 | Mishra | G06F 13/364 |
| 2017/0048352 A1* | 2/2017 | Imamura | G06F 16/182 |
| 2017/0075827 A1* | 3/2017 | Ward | G06F 13/368 |
| 2017/0125119 A1* | 5/2017 | Loh | G11C 29/88 |
| 2018/0088444 A1* | 3/2018 | Matsumoto | H04N 5/23206 |
| 2018/0143921 A1* | 5/2018 | Jiang | G06F 13/1678 |
| 2018/0359055 A1* | 12/2018 | Shintomi | H04L 1/0063 |
| 2019/0108293 A1* | 4/2019 | Morton | G06F 30/327 |
| 2019/0342106 A1* | 11/2019 | Li | H04L 9/3278 |
| 2019/0362804 A1* | 11/2019 | Kim | G01R 31/318513 |
| 2020/0133865 A1* | 4/2020 | Mannava | G06F 12/1009 |

* cited by examiner

| ACTIVATED CHIP | CID<2> | CID<1> |
|---|---|---|
| FIRST SLAVE CHIP | L | L |
| SECOND SLAVE CHIP | L | H |
| THIRD SLAVE CHIP | H | L |
| FOURTH SLAVE CHIP | H | H |

FIG. 3

SEMICONDUCTOR DEVICES

CROSS-REFERENCE TO RELATED APPLICATIONS

The present application claims priority under 35 U.S.C 119(a) to Korean Application No. 10-2019-0111075, filed on Sep. 6, 2019, which is incorporated herein by reference in its entirety.

BACKGROUND

1. Technical Field

Embodiments of the present disclosure generally relate to semiconductor devices receiving and outputting data via through electrodes.

2. Related Art

Recently, three-dimensional semiconductor devices have been developed to increase the integration density thereof. Each of the three-dimensional semiconductor devices may be realized by vertically stacking a plurality of semiconductor chips to achieve a maximum integration density on a limited area.

Each of the three-dimensional semiconductor chips may be realized using a through silicon via (TSV) technique that electrically connects all of semiconductor chips vertically stacked to each other with silicon vias vertically penetrating the semiconductor chips. Accordingly, the three-dimensional semiconductor devices fabricated using the TSVs may efficiently reduce a packaging area thereof as compared with three-dimensional semiconductor devices fabricated using bonding wires.

SUMMARY

According to an embodiment, a semiconductor device may include a master chip and a first slave chip. The master chip outputs a write signal and a chip identification (ID) signal and outputs data through a transmitter activated by the write signal. The first slave chip may enter a write operation according to the write signal and activates a first receiver to store the data when the chip ID signal has a first logic level combination. The master chip and the first slave chip may be vertically stacked. The master chip and the first slave chip may be electrically connected to each other by a plurality of through electrodes penetrating the first slave chip.

According to another embodiment, a semiconductor device may include a master chip, a first slave chip, and a second slave chip. The master chip may be configured to output a write signal, a read signal, and a chip identification (ID) signal, configured to output first data through a first transmitter activated by the write signal, and configured to receive second data through a first receiver activated by the read signal. The first slave chip may be configured to enter a write operation according to the write signal, configured to activate a second receiver to store the first data when the chip ID signal has a first logic level combination, configured to enter a read operation according to the read signal, and configured to activate a second transmitter to output the second data when the chip ID signal has the first logic level combination. The second slave chip may be configured to enter the write operation according to the write signal, configured to activate a third receiver to store the first data when the chip ID signal has a second logic level combination, configured to enter the read operation according to the read signal, and configured to activate a third transmitter to output the second data when the chip ID signal has the second logic level combination. The master chip, the first slave chip, and the second slave chip may be vertically stacked. The master chip, the first slave chip, and the second slave chip may be electrically connected to each other by a plurality of through electrodes penetrating the master chip, the first slave chip, and the second slave chip.

According to an embodiment, a semiconductor device may include a master chip and a first slave chip. The master chip may be configured to output a read signal and a chip identification (ID) signal and configured to receive data through a receiver activated by the read signal. The first slave chip may be configured to enter a read operation according to the read signal and configured to activate a first transmitter to output the data when the chip ID signal has a first logic level combination. The master chip and the first slave chip may be vertically stacked. The master chip and the first slave chip may be electrically connected to each other by a plurality of through electrodes penetrating the first slave chip.

BRIEF DESCRIPTION OF THE DRAWINGS

FIG. 3 is a table illustrating slave chips activated according to a logic level combination of a chip ID signal outputted from the operation setup circuit shown in FIG. 2.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Further, the logic levels of the signals may be different from or the opposite of those described. For example, a signal described as having a logic "high" level may alternatively have a logic "low" level, and a signal described as having a logic "low" level may alternatively have a logic "high" level.

For reference, an embodiment including additional components may be provided. Furthermore, a high or low configuration indicating a state of a signal or circuit may be changed depending on embodiments. Furthermore, the configuration of a transistor required for implementing the same function may be modified. That is, the configuration of the PMOS transistor and the configuration of the NMOS transistor may be replaced with each other, depending on a specific situation. If necessary, various transistors may be applied to implement the configurations. Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations.

In the description of the present disclosure, the terms "first" and "second" may be used to describe various components, but the components are not limited by the terms. The terms may be used to distinguish one component from another component. For example, a first component may be called a second component and a second component may be called a first component without departing from the scope of the present disclosure.

Figure 1:
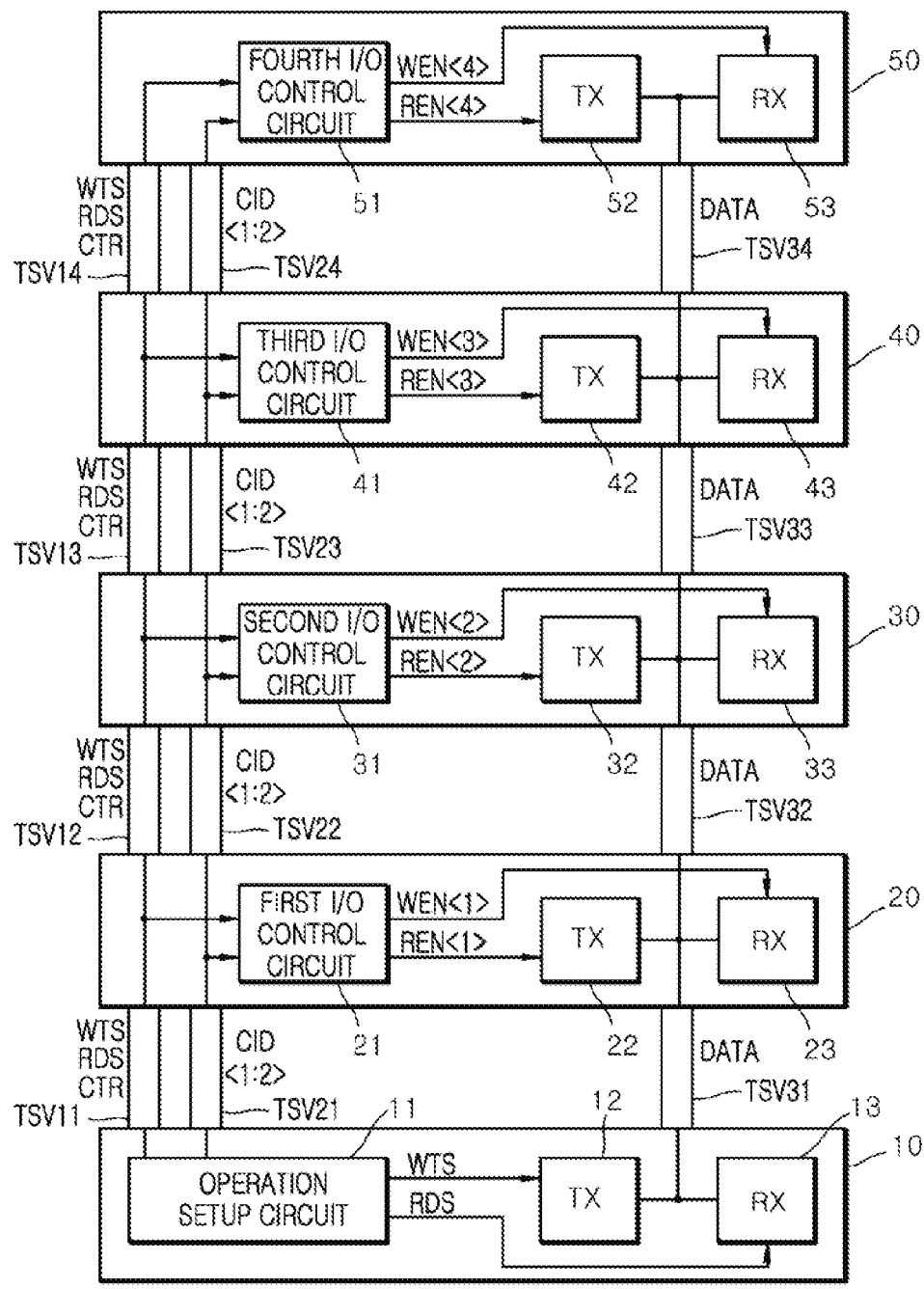
FIG. 1 is a block diagram illustrating a configuration of a semiconductor device according to an embodiment of the present disclosure.

As illustrated in FIG. 1, a semiconductor device 1 according to an embodiment may include a master chip 10, a first slave chip 20, a second slave chip 30, a third slave chip 40, and a fourth slave chip 50.

The master chip 10 may include an operation setup circuit 11, a first transmitter 12, and a first receiver 13.

The operation setup circuit 11 may generate a write signal WTS, a read signal RDS, a control signal CTR, and first and second chip identification (ID) signals CID<1:2>. The operation setup circuit 11 may output the write signal for activating a write operation via through electrodes TSV11, TSV12, TSV13 and TSV14. The operation setup circuit 11 may output the read signal for activating a read operation via the through electrodes TSV11, TSV12, TSV13 and TSV14. The operation setup circuit 11 may output the control signal CTR via the through electrodes TSV11, TSV12, TSV13 and TSV14. The operation setup circuit 11 may output the first and second chip ID signals CID<1:2> via through electrodes TSV21, TSV22, TSV23 and TSV24. Although FIG. 1 illustrates an example in which the write signal WTS, the read signal RDS, and the control signal CTR are transmitted through a single interconnection line comprised of the through electrodes TSV11, TSV12, TSV13 and TSV14 connected in series, the embodiments are not limited thereto. For example, in some other embodiments, the write signal WTS, the read signal RDS, and the control signal CTR may be transmitted through respective ones of three separate interconnection lines. Although FIG. 1 illustrates an example in which the first and second chip ID signals CID<1:2> are transmitted through a single interconnection line comprised of the through electrodes TSV21, TSV22, TSV23 and TSV24 connected in series, the embodiments are not limited thereto. For example, in some embodiments, the first and second chip ID signals CID<1:2> may be transmitted through respective ones of two separate interconnection lines.

The first transmitter 12 may be enabled by the write signal WTS. The first transmitter 12 may be enabled to output data DATA via through electrodes TSV31, TSV32, TSV33 and TSV34 connected in series when the write signal WTS for activating the write operation is inputted to the first transmitter 12.

The first receiver 13 may be enabled by the read signal RDS. The first receiver 13 may be enabled to receive the data DATA via the through electrodes TSV31, TSV32, TSV33 and TSV34 when the read signal RDS for activating the read operation is inputted to the first receiver 13.

As described above, the master chip 10 may output the write signal WTS, the control signal CTR, and the first and second chip ID signals CID<1:2> during the write operation, and the first transmitter 12 may be enabled to output the data DATA via the through electrodes TSV31, TSV32, TSV33 and TSV34 during the write operation. The master chip 10 may output the read signal RDS, the control signal CTR, and the first and second chip ID signals CID<1:2> during the read operation, and the first receiver 13 may be enabled to receive the data DATA via the through electrodes TSV31, TSV32, TSV33 and TSV34 during the read operation.

The first slave chip 20 may include a first input/output (I/O) control circuit 21, a second transmitter 22, and a second receiver 23.

The first I/O control circuit 21 may receive the write signal WTS, the read signal RDS, the control signal CTR, and the first and second chip ID signals CID<1:2> to generate a first write enablement signal WEN<1> and a first read enablement signal REN<1>. The first I/O control circuit 21 may generate the first write enablement signal WEN<1> which is enabled when the write signal WTS and the control signal CTR are enabled and the first and second chip ID signals CID<1:2> have a first logic level combination. The first I/O control circuit 21 may generate the first read enablement signal REN<1> which is enabled when the read signal RDS and the control signal CTR are enabled and the first and second chip ID signals CID<1:2> have the first logic level combination. The first logic level combination of the first and second chip ID signals CID<1:2> will be described with reference to FIG. 3 later.

The second transmitter 22 may be enabled by the first read enablement signal REN<1>. The second transmitter 22 may be enabled by the first read enablement signal REN<1> to output internal data (not shown) stored therein as the data DATA. The second transmitter 22 may be enabled to output the data DATA via the through electrodes TSV31, TSV32, TSV33 and TSV34 when the first read enablement signal REN<1> is inputted to the second transmitter 22 during the read operation.

The second receiver 23 may be enabled by the first write enablement signal WEN<1>. The second receiver 23 may be enabled to receive the data DATA via the through electrodes TSV31, TSV32, TSV33 and TSV34 when the first write enablement signal WEN<1> is inputted to the second receiver 23 during the write operation. The second receiver 23 may be enabled by the first write enablement signal WEN<1> to receive the data DATA and to store the data DATA as the internal data (not shown).

According to the first slave chip 20 described above, the second receiver 23 of the first slave chip 20 may be enabled to store the data DATA when the first and second chip ID signals CID<1:2> have the first logic level combination during the write operation. In addition, the second transmitter 22 of the first slave chip 20 may be enabled to output the data DATA when the first and second chip ID signals CID<1:2> have the first logic level combination during the read operation.

The second slave chip 30 may include a second I/O control circuit 31, a third transmitter 32, and a third receiver 33.

The second I/O control circuit 31 may receive the write signal WTS, the read signal RDS, the control signal CTR, and the first and second chip ID signals CID<1:2> to generate a second write enablement signal WEN<2> and a second read enablement signal REN<2>. The second I/O control circuit 31 may generate the second write enablement signal WEN<2> which is enabled when the write signal WTS and the control signal CTR are enabled and the first and second chip ID signals CID<1:2> have a second logic level combination. The second I/O control circuit 31 may generate the second read enablement signal REN<2> which is enabled when the read signal RDS and the control signal CTR are enabled and the first and second chip ID signals CID<1:2> have the second logic level combination. The second logic level combination of the first and second chip ID signals CID<1:2> will be described with reference to FIG. 3 later.

The third transmitter 32 may be enabled by the second read enablement signal REN<2>. The third transmitter 32 may be enabled by the second read enablement signal REN<2> to output internal data (not shown) stored therein as the data DATA. The third transmitter 32 may be enabled to output the data DATA via the through electrodes TSV31, TSV32, TSV33 and TSV34 when the second read enablement signal REN<2> is inputted to the third transmitter 32 during the read operation.

The third receiver 33 may be enabled by the second write enablement signal WEN<2>. The third receiver 33 may be enabled to receive the data DATA via the through electrodes TSV31, TSV32, TSV33 and TSV34 when the second write enablement signal WEN<2> is inputted to the third receiver 33 during the write operation. The third receiver 33 may be enabled by the second write enablement signal WEN<2> to receive the data DATA and to store the data DATA as the internal data (not shown).

According to the second slave chip 30 described above, the third receiver 33 of the second slave chip 30 may be enabled to store the data DATA when the first and second chip ID signals CID<1:2> have the second logic level combination during the write operation. In addition, the third transmitter 32 of the second slave chip 30 may be enabled to output the data DATA when the first and second chip ID signals CID<1:2> have the second logic level combination during the read operation.

The third slave chip 40 may include a third I/O control circuit 41, a fourth transmitter 42, and a fourth receiver 43.

The third I/O control circuit 41 may receive the write signal WTS, the read signal RDS, the control signal CTR, and the first and second chip ID signals CID<1:2> to generate a third write enablement signal WEN<3> and a third read enablement signal REN<3>. The third I/O control circuit 41 may generate the third write enablement signal WEN<3> which is enabled when the write signal WTS and the control signal CTR are enabled and the first and second chip ID signals CID<1:2> have a third logic level combination. The third I/O control circuit 41 may generate the third read enablement signal REN<3> which is enabled when the read signal RDS and the control signal CTR are enabled and the first and second chip ID signals CID<1:2> have the third logic level combination. The third logic level combination of the first and second chip ID signals CID<1:2> will be described with reference to FIG. 3 later.

The fourth transmitter 42 may be enabled by the third read enablement signal REN<3>. The fourth transmitter 42 may be enabled by the third read enablement signal REN<3> to output internal data (not shown) stored therein as the data DATA. The fourth transmitter 42 may be enabled to output the data DATA via the through electrodes TSV31, TSV32, TSV33 and TSV34 when the third read enablement signal REN<3> is inputted to the fourth transmitter 42 during the read operation.

The fourth receiver 43 may be enabled by the third write enablement signal WEN<3>. The fourth receiver 43 may be enabled to receive the data DATA via the through electrodes TSV31, TSV32, TSV33 and TSV34 when the third write enablement signal WEN<3> is inputted to the fourth receiver 43 during the write operation. The fourth receiver 43 may be enabled by the third write enablement signal WEN<3> to receive the data DATA and to store the data DATA as the internal data (not shown).

According to the third slave chip 40 described above, the fourth receiver 43 of the third slave chip 40 may be enabled to store the data DATA when the first and second chip ID signals CID<1:2> have the third logic level combination during the write operation. In addition, the fourth transmitter 42 of the third slave chip 40 may be enabled to output the data DATA when the first and second chip ID signals CID<1:2> have the third logic level combination during the read operation.

The fourth slave chip 50 may include a fourth I/O control circuit 51, a fifth transmitter 52, and a fifth receiver 53.

The fourth I/O control circuit 51 may receive the write signal WTS, the read signal RDS, the control signal CTR, and the first and second chip ID signals CID<1:2> to generate a fourth write enablement signal WEN<4> and a fourth read enablement signal REN<4>. The fourth I/O control circuit 51 may generate the fourth write enablement signal WEN<4> which is enabled when the write signal WTS and the control signal CTR are enabled and the first and second chip ID signals CID<1:2> have a fourth logic level combination. The fourth I/O control circuit 51 may generate the fourth read enablement signal REN<4> which is enabled when the read signal RDS and the control signal CTR are enabled and the first and second chip ID signals CID<1:2> have the fourth logic level combination. The fourth logic level combination of the first and second chip ID signals CID<1:2> will be described with reference to FIG. 3 later.

The fifth transmitter 52 may be enabled by the fourth read enablement signal REN<4>. The fifth transmitter 52 may be enabled by the fourth read enablement signal REN<4> to output internal data (not shown) stored therein as the data DATA. The fifth transmitter 52 may be enabled to output the data DATA via the through electrodes TSV31, TSV32, TSV33 and TSV34 when the fourth read enablement signal REN<4> is inputted to the fifth transmitter 52 during the read operation.

The fifth receiver 53 may be enabled by the fourth write enablement signal WEN<4>. The fifth receiver 53 may be enabled to receive the data DATA via the through electrodes TSV31, TSV32, TSV33 and TSV34 when the fourth write enablement signal WEN<4> is inputted to the fifth receiver 53 during the write operation. The fifth receiver 53 may be enabled by the fourth write enablement signal WEN<4> to receive the data DATA and to store the data DATA as the internal data (not shown).

According to the fourth slave chip 50 described above, the fifth receiver 53 of the fourth slave chip 50 may be enabled to store the data DATA when the first and second chip ID signals CID<1:2> have the fourth logic level combination during the write operation. In addition, the fifth transmitter 52 of the fourth slave chip 50 may be enabled to output the data DATA when the first and second chip ID signals CID<1:2> have the fourth logic level combination during the read operation.

The master chip 10 and the first slave chip 20 may be vertically stacked and may be electrically connected to each other by the through electrodes TSV11, TSV21 and TSV31. The first slave chip 20 and the second slave chip 30 may be vertically stacked and may be electrically connected to each other by the through electrodes TSV12, TSV22 and TSV32. The second slave chip 30 and the third slave chip 40 may be vertically stacked and may be electrically connected to each other by the through electrodes TSV13, TSV23 and TSV33. The third slave chip 40 and the fourth slave chip 50 may be vertically stacked and may be electrically connected to each other by the through electrodes TSV14, TSV24 and TSV34. Although FIG. 1 illustrates an example in which the through electrodes TSV11, TSV12, TSV13 and TSV14 are realized using a plurality of through silicon vias vertically stacked, but not limited thereto. For example, in some embodiments, the through electrodes TSV11, TSV12, TSV13 and TSV14 may be realized using a single through silicon via. In addition, although FIG. 1 illustrates an example in which the through electrodes TSV21, TSV22, TSV23 and TSV24 are realized using a plurality of through silicon vias vertically stacked, although the embodiments are not limited thereto. For example, in some embodiments, the through electrodes TSV21, TSV22, TSV23 and TSV24 may be realized using a single through silicon via. Moreover, although FIG. 1 illustrates an example in which the through electrodes TSV31, TSV32, TSV33 and TSV34 are realized using a plurality of through silicon vias vertically stacked, although the embodiments are not limited thereto. For example, in some embodiments, the through electrodes TSV31, TSV32, TSV33 and TSV34 may be realized using a single through silicon via.

Figure 2:
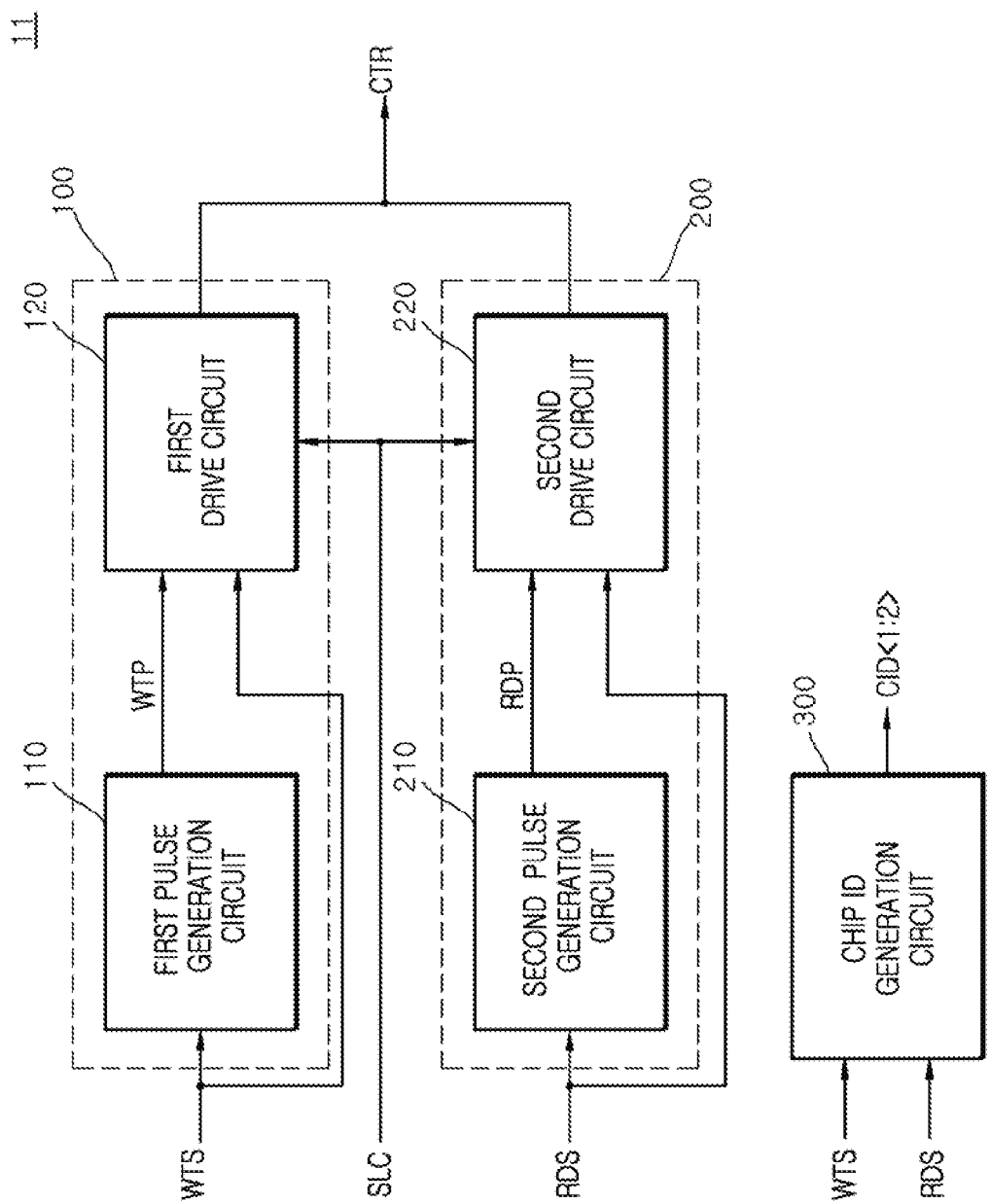
FIG. 2 is a block diagram illustrating a configuration of an operation setup circuit included in the semiconductor device of FIG. 1.

Referring to FIG. 2, the operation setup circuit 11 may include a write operation setup circuit 100, a read operation setup circuit 200, and a chip ID generation circuit 300.

The write operation setup circuit 100 may include a first pulse generation circuit 110 and a first drive circuit 120.

The first pulse generation circuit 110 may generate a write pulse WTP when the write signal WTS is inputted to the first pulse generation circuit 110. The first pulse generation circuit 110 may generate the write pulse WTP having a logic "low" level when the write signal WTS having a logic "high" level is inputted to the first pulse generation circuit 110.

The first drive circuit 120 may generate the control signal CTR according to the write pulse WTP when an operation setup signal SLC is inputted to the first drive circuit 120. The first drive circuit 120 may generate the control signal CTR which is enabled to have a logic "high" level according to the write pulse WTP having a logic "low" level when the operation setup signal SLC is enabled to have a logic "high" level.

As described above, the write operation setup circuit 100 may generate the control signal CTR which is enabled when the write signal WTS and the operation setup signal SLC are inputted to the write operation setup circuit 100 during the write operation. The write operation setup circuit 100 may output the control signal CTR via the through electrodes TSV11, TSV12, TSV13 and TSV14 during the write operation. The operation setup signal SLC may be set as a signal which is enabled when the master chip 10 is activated during the write operation and the read operation.

The read operation setup circuit 200 may include a second pulse generation circuit 210 and a second drive circuit 220.

The second pulse generation circuit 210 may generate a read pulse RDP when the read signal RDS is inputted to the second pulse generation circuit 210. The second pulse generation circuit 210 may generate the read pulse RDP having a logic "low" level when the read signal RDS having a logic "high" level is inputted to the second pulse generation circuit 210.

The second drive circuit 220 may generate the control signal CTR according to the read pulse RDP when the operation setup signal SLC is inputted to the second drive circuit 220. The second drive circuit 220 may generate the control signal CTR which is enabled to have a logic "high" level by the read pulse RDP having a logic "low" level when the operation setup signal SLC is enabled to have a logic "high" level.

As described above, the read operation setup circuit 200 may generate the control signal CTR which is enabled when the read signal RDS and the operation setup signal SLC are inputted to the read operation setup circuit 200 during the read operation. The read operation setup circuit 200 may output the control signal CTR via the through electrodes TSV11, TSV12, TSV13 and TSV14 during the read operation.

The chip ID generation circuit 300 may generate the first and second chip ID signals CID<1:2> when the write signal WTS is inputted to the chip ID generation circuit 300. The chip ID generation circuit 300 may output the first and second chip ID signals CID<1:2> via the through electrodes TSV21, TSV22, TSV23 and TSV24 when the write signal WTS is inputted to the chip ID generation circuit 300. The chip ID generation circuit 300 may generate the first and second chip ID signals CID<1:2> when the read signal RDS is inputted to the chip ID generation circuit 300. The chip ID generation circuit 300 may output the first and second chip ID signals CID<1:2> via the through electrodes TSV21, TSV22, TSV23 and TSV24 when the read signal RDS is inputted to the chip ID generation circuit 300.

The first to fourth slave chips 20, 30, 40 and 50, which are activated by the first to fourth logic level combinations of the first and second chip ID signals CID<1:2> to perform the write operation or the read operation, will be described hereinafter with reference to FIG. 3.

First, the first logic level combination of the first and second chip ID signals CID<1:2> means that the first chip ID signal CID<1> has a logic "low(L)" level and the second chip ID signal CID<2> has a logic "low(L)" level. When the first and second chip ID signals CID<1:2> have the first logic level combination, the first slave chip 20 may be activated to perform the write operation or the read operation.

Next, the second logic level combination of the first and second chip ID signals CID<1:2> means that the first chip ID signal CID<1> has a logic "high(H)" level and the second chip ID signal CID<2> has a logic "low(L)" level. When the first and second chip ID signals CID<1:2> have the second logic level combination, the second slave chip 30 may be activated to perform the write operation or the read operation.

Next, the third logic level combination of the first and second chip ID signals CID<1:2> means that the first chip ID signal CID<1> has a logic "low(L)" level and the second chip ID signal CID<2> has a logic "high(H)" level. When the first and second chip ID signals CID<1:2> have the third logic level combination, the third slave chip 40 may be activated to perform the write operation or the read operation.

Finally, the fourth logic level combination of the first and second chip ID signals CID<1:2> means that the first chip ID signal CID<1> has a logic "high(H)" level and the second chip ID signal CID<2> has a logic "high(H)" level. When the first and second chip ID signals CID<1:2> have the fourth logic level combination, the fourth slave chip 50 may be activated to perform the write operation or the read operation.

Figure 4:
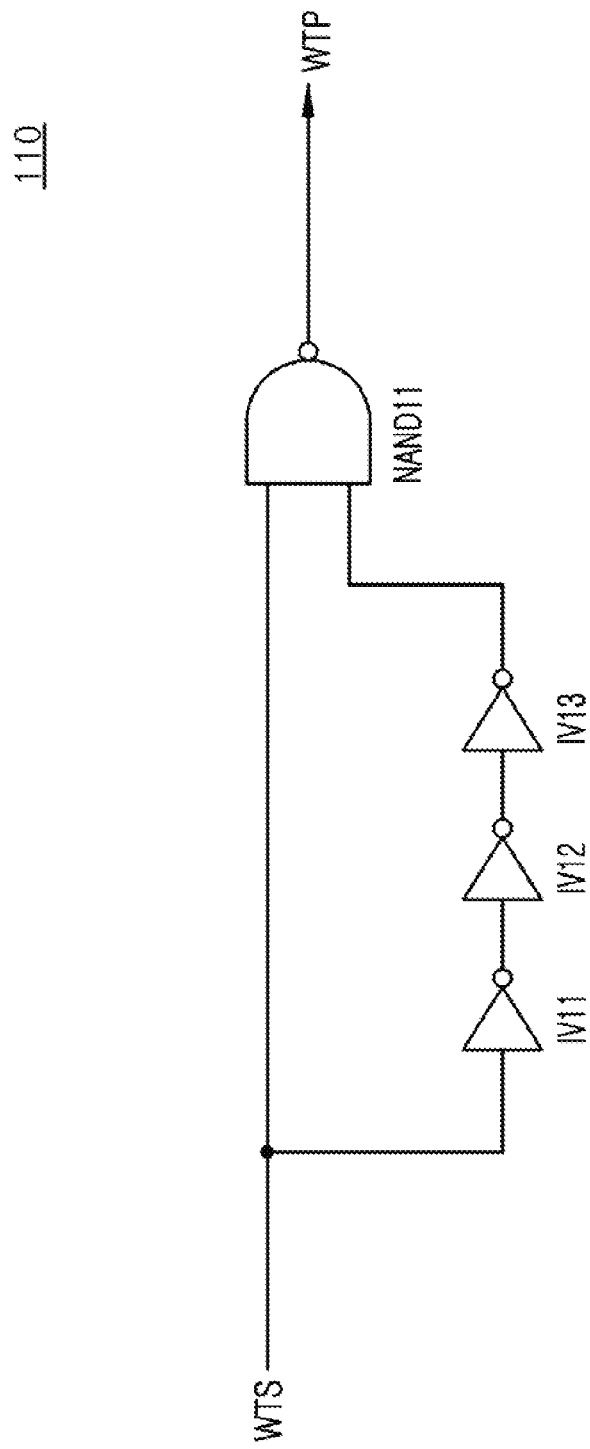
FIG. 4 is a circuit diagram illustrating a configuration of a first pulse generation circuit included in the operation setup circuit of FIG. 2.

Referring to FIG. 4, the first pulse generation circuit 110 may be realized using inverters IV11, IV12 and IV13 and a NAND gate NAND11.

The first pulse generation circuit 110 may generate the write pulse having a logic "low" level when the write signal WTS is enabled to have a logic "high" level. The first pulse generation circuit 110 may generate the write pulse having a logic "low" level, a pulse width of which is set by a total delay time of the inverters IV11, IV12 and IV13, when the write signal WTS is enabled to have a logic "high" level.

In an embodiment, the second pulse generation circuit 210 illustrated in FIG. 2 may be realized using substantially the same circuit as the first pulse generation circuit 110 illustrated in FIG. 4 except I/O signals thereof. Thus, detailed descriptions of the second pulse generation circuit 210 will be omitted hereinafter.

Figure 5:
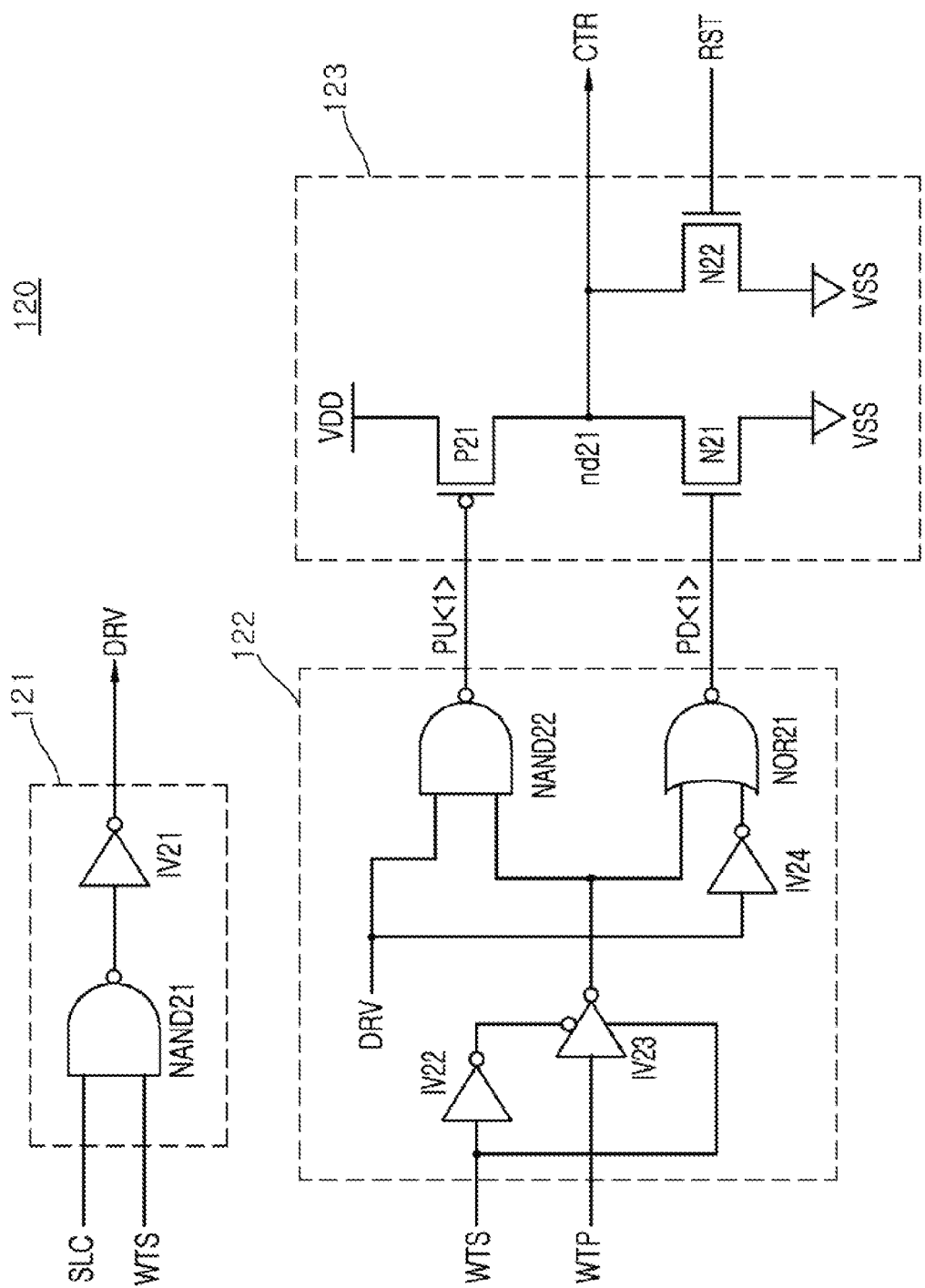
FIG. 5 is a circuit diagram illustrating a configuration of a first drive circuit included in the operation setup circuit of FIG. 2.

Referring to FIG. 5, the first drive circuit 120 may include a drive signal generation circuit 121, a first pull-up/pull-down signal generation circuit 122, and a first control signal output circuit 123.

The drive signal generation circuit 121 may be realized using a NAND gate NAND21 and an inverter IV21. The drive signal generation circuit 121 may generate a drive signal DRV which is enabled while both of the operation setup signal SLC and the write signal WTS are enabled. The drive signal generation circuit 121 may generate the drive signal DRV which is enabled to have a logic "high" level while both of the operation setup signal SLC and the write signal WTS are enabled to have a logic "high" level. The drive signal generation circuit 121 may perform a logical AND operation of the operation setup signal SLC and the write signal WTS to generate the drive signal DRV.

The first pull-up/pull-down signal generation circuit 122 may be realized using inverters IV22, IV23 and IV24, a NAND gate NAND22, and a NOR gate NOR21. The first pull-up/pull-down signal generation circuit 122 may generate a first pull-up signal PU<1> and a first pull-down signal PD<1>, one of which is selectively enabled according to a logic level of the write pulse WTP while the write signal WTS and the drive signal DRV are enabled. The first pull-up/pull-down signal generation circuit 122 may generate the first pull-up signal PU<1> which is enabled to have a logic "low" level when the write pulse WTP has a logic "low" level while the write signal WTS and the drive signal DRV are enabled to have a logic "high" level. The first pull-up/pull-down signal generation circuit 122 may generate the first pull-down signal PD<1> which is enabled to have a logic "high" level when the write pulse WTP has a logic "high" level while the write signal WTS and the drive signal DRV are enabled to have a logic "high" level.

The first control signal output circuit 123 may be realized using a PMOS transistor P21 coupled between a power supply voltage VDD terminal and a node nd21 and turned on by the first pull-up signal PU<1>, an NMOS transistor N21 coupled between the node nd21 and a ground voltage VSS terminal and turned on by the first pull-down signal PD<1>, and an NMOS transistor N22 coupled between the node nd21 and the ground voltage VSS terminal and turned on by a reset signal RST. When the first pull-up signal PU<1> has a logic "low" level, the PMOS transistor P21 may be turned on to drive the node nd21 to the power supply voltage VDD level and to generate the control signal CTR having a logic "high" level. When the first pull-down signal PD<1> has a logic "high" level, the NMOS transistor N21 may be turned on to drive the node nd21 to the ground voltage VSS level and to generate the control signal CTR having a logic "low" level. When the reset signal RST has a logic "high" level, the NMOS transistor N22 may be turned on to drive the node nd21 to the ground voltage VSS level and to generate the control signal CTR having a logic "low" level. The first control signal output circuit 123 may drive the control signal CTR according to the first pull-up signal PU<1> and the first pull-down signal PD<1> to output the driven control signal CTR via the through electrodes TSV11, TSV12, TSV13 and TSV14. The reset signal RST may be set as a signal which is enabled to have a logic "high" level during an initialization operation of the semiconductor device 1.

In an embodiment, the second drive circuit 220 illustrated in FIG. 2 may be realized using substantially the same circuit as the first drive circuit 120 illustrated in FIG. 5 except I/O signals thereof. Thus, detailed descriptions of the second drive circuit 220 will be omitted hereinafter.

Figure 6:
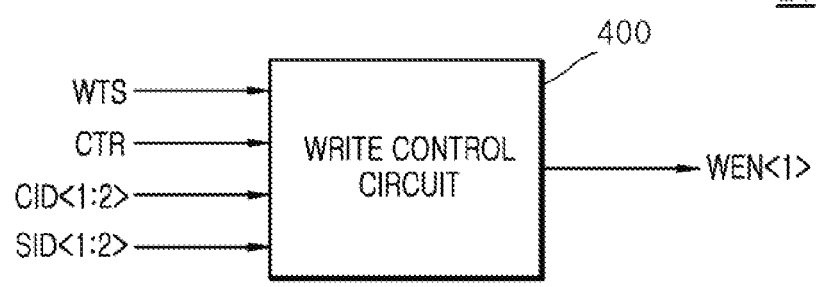
FIG. 6 is a block diagram illustrating a configuration of a first I/O control circuit included in the semiconductor device of FIG. 1.
Figure 6:
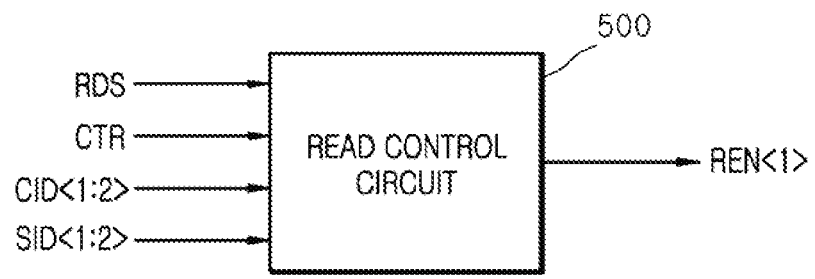

Referring to FIG. 6, the first I/O control circuit 21 may include a write control circuit 400 and a read control circuit 500.

The write control circuit 400 may compare the first and second chip ID signals CID<1:2> with first and second stored ID signals SID<1:2> to generate the first write enablement signal WEN<1> when the write signal WTS and the control signal CTR are enabled. The write control circuit 400 may generate the first write enablement signal WEN<1> which is enabled when the write signal WTS and the control signal CTR are enabled and the first and second chip ID signals CID<1:2> and the first and second stored ID signals SID<1:2> have the first logic level combination. The first and second stored ID signals SID<1:2> may be signals having a fixed logic level combination of the first logic level combination. As described with reference to FIG. 3, the first logic level combination of the first and second chip ID signals CID<1:2> means that the first chip ID signal CID<1> has a logic "low(L)" level and the second chip ID signal CID<2> has a logic "low(L)" level. Thus, the first logic level combination of the first and second stored ID signals SID<1:2> may also mean that the first stored ID signal SID<1> has a logic "low(L)" level and the second stored ID signal SID<2> has a logic "low(L)" level.

The read control circuit 500 may compare the first and second chip ID signals CID<1:2> with the first and second stored ID signals SID<1:2> to generate the first read enablement signal REN<1> when the read signal RDS and the control signal CTR are enabled. The read control circuit 500 may generate the first read enablement signal REN<1> which is enabled when the read signal RDS and the control signal CTR are enabled and the first and second chip ID signals CID<1:2> and the first and second stored ID signals SID<1:2> have the first logic level combination.

The first I/O control circuit 21 having the aforementioned configuration may generate the first write enablement signal WEN<1> when the write signal WTS and the control signal CTR are enabled and the first and second chip ID signals CID<1:2> and the first and second stored ID signals SID<1:2> have the first logic level combination during the write operation. The first I/O control circuit 21 may generate the first read enablement signal REN<1> when the read signal RDS and the control signal CTR are enabled and the first and second chip ID signals CID<1:2> and the first and second stored ID signals SID<1:2> have the first logic level combination during the read operation.

In an embodiment, each of the second, third, and fourth I/O control circuits 31, 41, and 51 illustrated in FIG. 1 may be realized using substantially the same circuit as the first I/O control circuit 21 illustrated in FIG. 6 except I/O signals thereof. Thus, detailed descriptions of the second, third, and fourth I/O control circuits 31, 41, and 51 will be omitted hereinafter.

Figure 7:
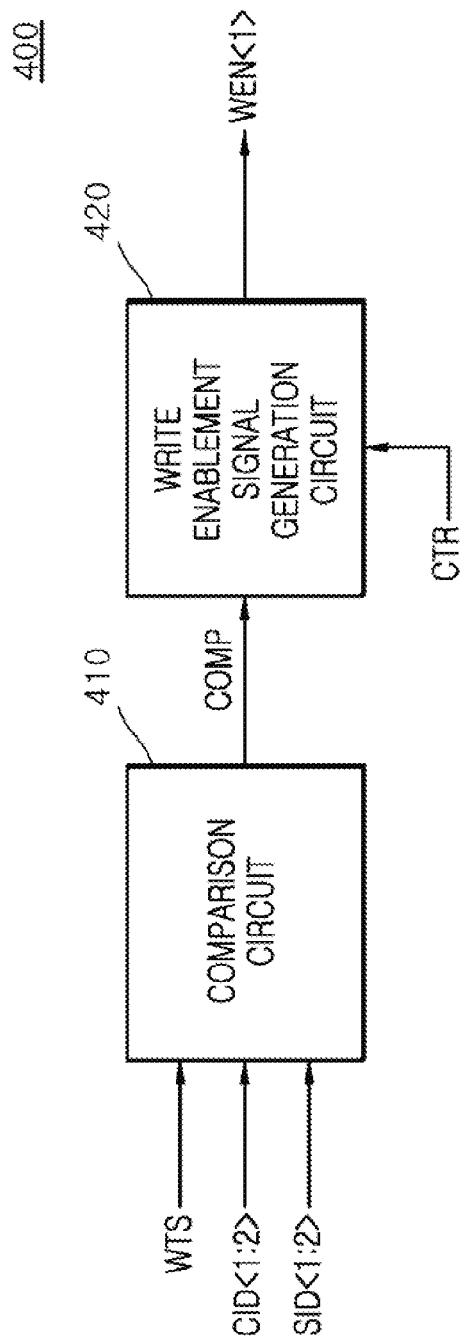
FIG. 7 is a block diagram illustrating a configuration of a write control circuit included in the first I/O control circuit of FIG. 6.

Referring to FIG. 7, the write control circuit 400 may include a comparison circuit 410 and a write enablement signal generation circuit 420.

The comparison circuit 410 may compare a logic level combination of the first and second stored ID signals SID<1:2> with a logic level combination of the first and second chip ID signals CID<1:2> to generate a comparison signal COMP while the write signal WTS is enabled. The comparison circuit 410 may generate the comparison signal COMP which is enabled when the first and second stored ID signals SID<1:2> and the first and second chip ID signals CID<1:2> have the same logic level combination while the write signal WTS is enabled.

The write enablement signal generation circuit 420 may generate the first write enablement signal WEN<1> from the comparison signal COMP while the control signal CTR is enabled. The write enablement signal generation circuit 420 may generate the first write enablement signal WEN<1> which is enabled when the comparison signal COMP is enabled while the control signal CTR is enabled.

Figure 8:
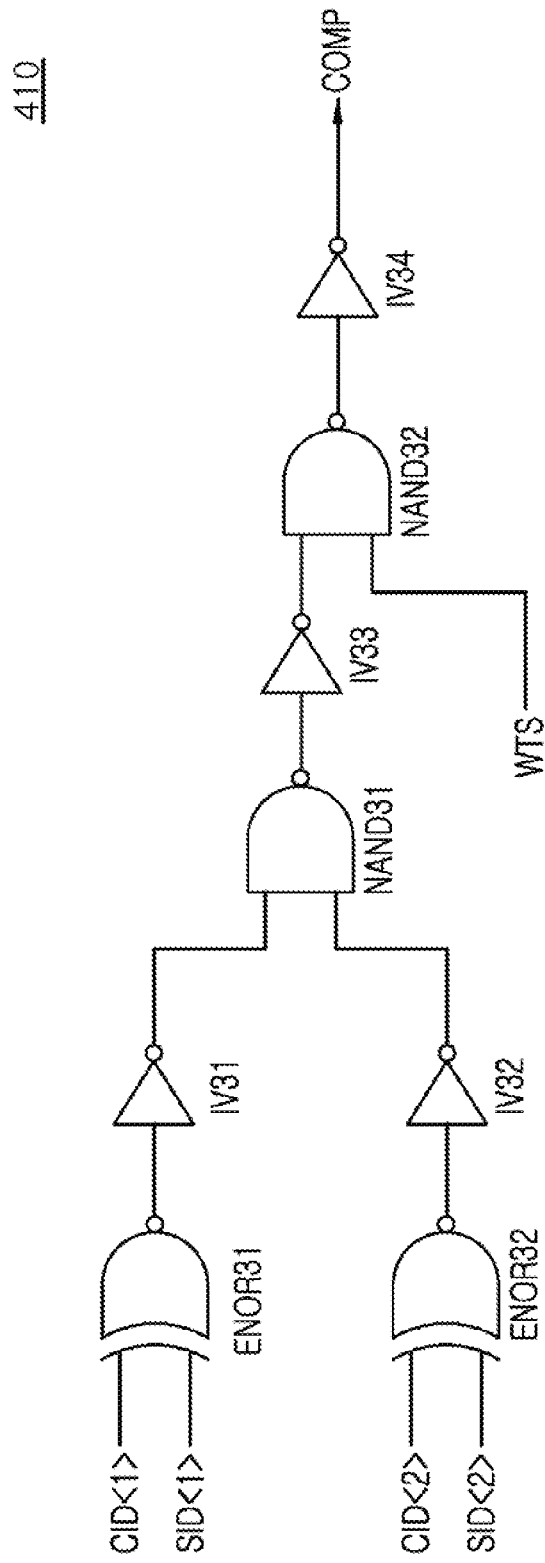
FIG. 8 is a circuit diagram illustrating a configuration of a comparison circuit included in the write control circuit of FIG. 7.

Referring to FIG. 8, the comparison circuit 410 may be realized using exclusive NOR gates ENOR31 and ENOR32, inverters IV31, IV32, IV33 and IV34, and NAND gates NAND31 and NAND32.

The comparison circuit 410 may generate the comparison signal COMP which is enabled to have a logic "high" level when the first and second stored ID signals SID<1:2> and the first and second chip ID signals CID<1:2> have the first logic level combination while the write signal WTS is enabled to have a logic "high" level.

Figure 9:
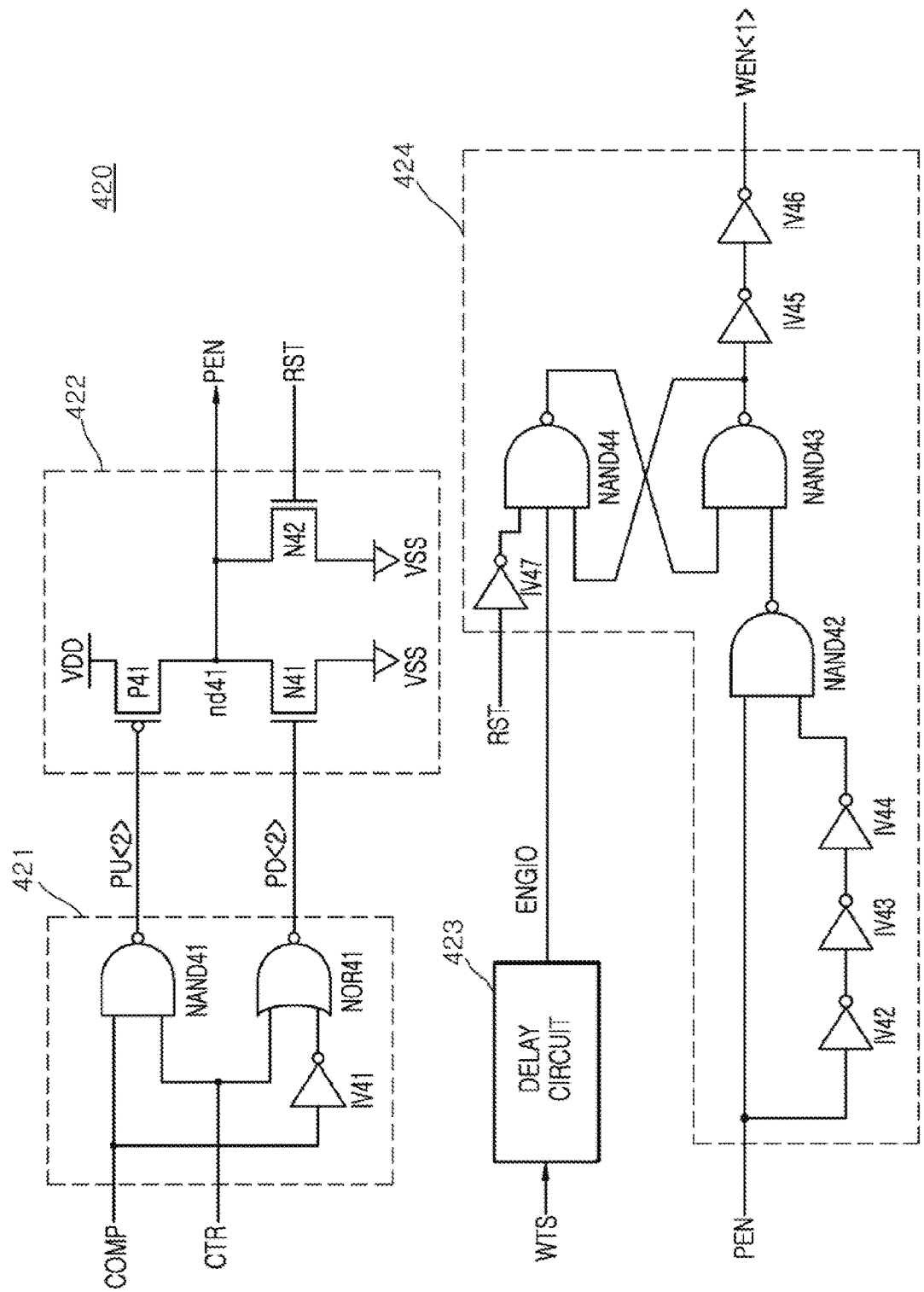
FIG. 9 illustrates a configuration of a write enablement signal generation circuit included in the write control circuit of FIG. 7.

Referring to FIG. 9, the write enablement signal generation circuit 420 may include a second pull-up/pull-down signal generation circuit 421, a pre-enablement signal generation circuit 422, a delay circuit 423, and a latch circuit 424.

The second pull-up/pull-down signal generation circuit 421 may be realized using an inverter IV41, a NAND gate NAND41, and a NOR gate NOR41. The second pull-up/pull-down signal generation circuit 421 may generate a second pull-up signal PU<2> and a second pull-down signal PD<2>, one of which is selectively enabled according to a logic level of the comparison signal COMP while the control signal CTR is enabled. The second pull-up/pull-down signal generation circuit 421 may generate the second pull-up signal PU<2> which is enabled to have a logic "low" level when the comparison signal COMP has a logic "high" level while the control signal CTR is enabled to have a logic "high" level. The second pull-up/pull-down signal generation circuit 421 may generate the second pull-down signal PD<2> which is enabled to have a logic "high" level when the comparison signal COMP has a logic "low" level while the control signal CTR is enabled to have a logic "high" level.

The pre-enablement signal generation circuit 422 may be realized using a PMOS transistor P41 coupled between the power supply voltage VDD terminal and a node nd41 and turned on by the second pull-up signal PU<2>, an NMOS transistor N41 coupled between the node nd41 and the ground voltage VSS terminal and turned on by the second pull-down signal PD<2>, and an NMOS transistor N42 coupled between the node nd41 and the ground voltage VSS terminal and turned on by the reset signal RST. When the second pull-up signal PU<2> is enabled to have a logic "low" level, the PMOS transistor P41 may be turned on to drive the node nd41 to the power supply voltage VDD level and to generate a pre-enablement signal PEN having a logic "high" level. When the second pull-down signal PD<2> is enabled to have a logic "high" level, the NMOS transistor N41 may be turned on to drive the node nd41 to the ground voltage VSS level and to generate the pre-enablement signal PEN having a logic "low" level. When the reset signal RST is enabled to have a logic "high" level, the NMOS transistor N42 may be turned on to drive the node nd41 to the ground voltage VSS level and to generate the pre-enablement signal PEN having a logic "low" level.

The delay circuit 423 may delay the write signal WTS by a write latency period and may control a pulse width of the write signal WTS to generate a write delay signal ENGIO. The write latency period may be set as an interval time between a point in time when the write signal WTS is generated and a point in time when data is written. A delay time for delaying the write signal WTS may be set to be different according to the embodiments.

The latch circuit 424 may be realized using inverters IV42, IV43, IV44, IV45, IV46, and IV47 and NAND gates NAND42, NAND43, and NAND45. The latch circuit 424 may generate the first write enablement signal WEN<1> which is enabled to have a logic "high" level when the pre-enablement signal PEN is enabled to have a logic "high" level. The latch circuit 424 may generate the first write enablement signal WEN<1> which is disabled to have a logic "low" level when the reset signal RST is disabled to have a logic "low" level and the write delay signal ENGIO has a logic "low" level.

Figure 10:
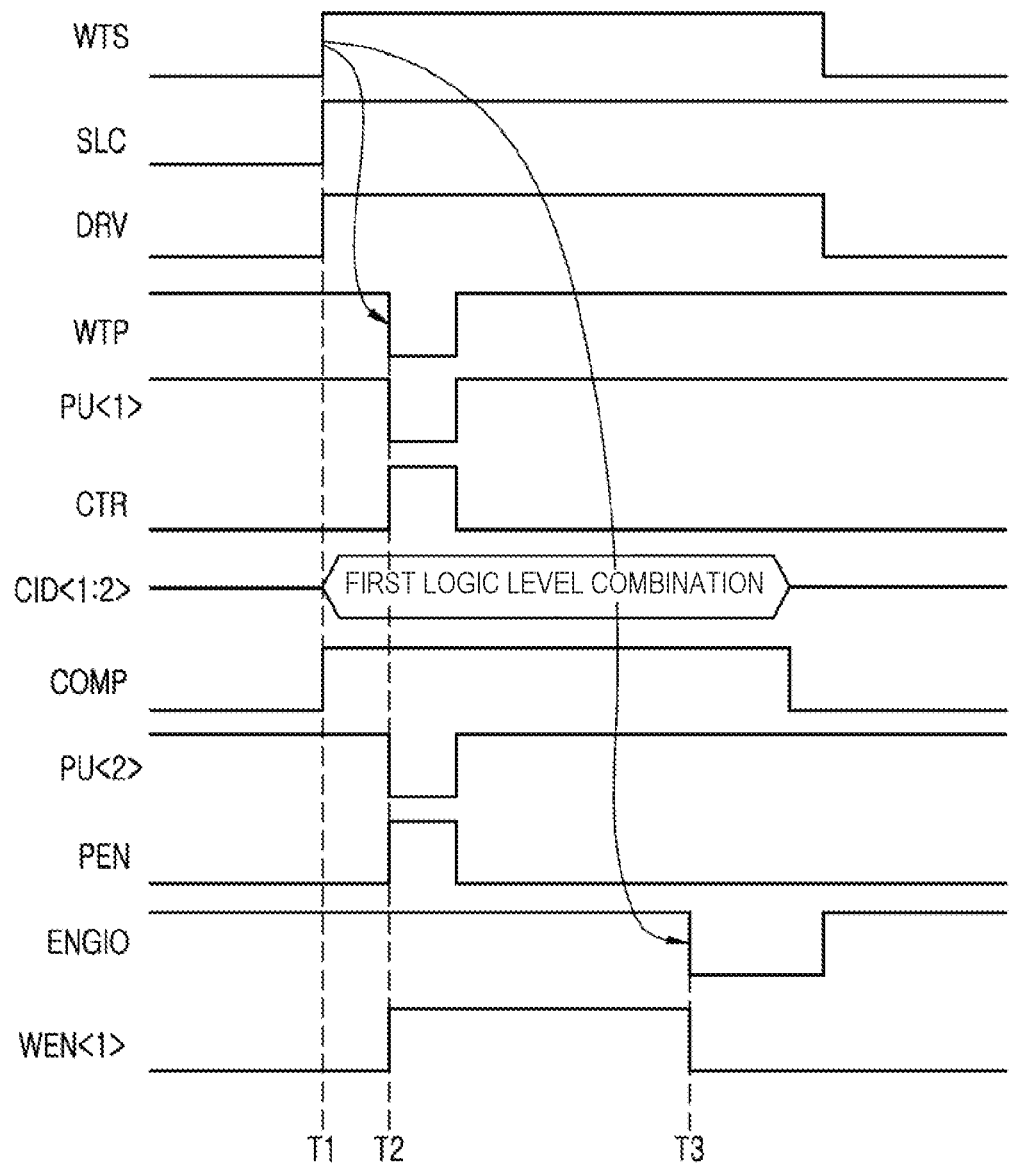
FIG. 10 is a timing diagram illustrating a write operation of a semiconductor device according an embodiment of the present disclosure.

The write operation of the semiconductor device 1 will be described hereinafter with reference to FIG. 10 in conjunction with a case that the first slave chip 20 is activated by the first and second chip ID signals CID<1:2> to perform the write operation of the first slave chip 20.

At a point in time "T1", the operation setup circuit 11 may generate the write signal WTS having a logic "high" level to enter the write operation. The operation setup circuit 11 may generate the first and second chip ID signals CID<1:2> having the first logic level combination.

The first transmitter 12 may be activated by the write signal WTS having a logic "high" level to output the data DATA provided by an external device via the through electrodes TSV31, TSV32, TSV33 and TSV34. In such a case, the first receiver 13 may be inactivated by the read signal RDS having a logic "low" level.

The drive signal generation circuit 121 of the first drive circuit 120 may generate the drive signal DRV which is enabled to have a logic "high" level because the operation setup signal SLC and the write signal WTS are enabled to have a logic "high" level.

The comparison circuit 410 included in the first I/O control circuit 21 of the first slave chip 20 may compare the first and second chip ID signals CID<1:2> having the first logic level combination with the first and second stored ID signals SID<1:2> having the first logic level combination while the write signal WTS is enabled to have a logic "high"

level, thereby generating the comparison signal COMP which is enabled to have a logic "high" level.

At a point in time "T2", the first pulse generation circuit 110 may generate a write pulse WTP having a logic "low" level, which is created from the write signal WTS generated to have a logic "high" level at the point in time "T1".

The first pull-up/pull-down signal generation circuit 122 of the first drive circuit 120 may generate the first pull-up signal PU<1> which is enabled to have a logic "low" level by the write pulse WTP having a logic "low" level while the write signal WTS and the drive signal DRV are enabled to have a logic "high" level.

The first control signal output circuit 123 of the first drive circuit 120 may generate the control signal CTR which is enabled to have a logic "high" level by the first pull-up signal PU<1> having a logic "low" level.

The second pull-up/pull-down signal generation circuit 421 included in the write enablement signal generation circuit 420 may generate the second pull-up signal PU<2> which is enabled to have a logic "low" level by the comparison signal COMP having a logic "high" level while the control signal CTR is enabled to have a logic "high" level.

The pre-enablement signal generation circuit 422 included in the write enablement signal generation circuit 420 may generate the pre-enablement signal PEN having a logic "high" level according to the second pull-up signal PU<2> having a logic "low" level.

The latch circuit 424 included in the write enablement signal generation circuit 420 may generate the first write enablement signal WEN<1> which is enabled to have a logic "high" level by the pre-enablement signal PEN having a logic "high" level.

The second receiver 23 may be activated by the first write enablement signal WEN<1> to receive the data DATA via the through electrodes TSV31, TSV32, TSV33 and TSV34 and to execute the write operation of the first slave chip 20. In such a case, the second transmitter 22 may be inactivated by the first read enablement signal REN<1> having a logic "low" level.

At a point in time "T3", the delay circuit 423 may delay the write signal WTS by the write latency period and may control a pulse width of the write signal WTS to generate the write delay signal ENGIO having a logic "low" level. The write latency period may be set as an interval time between a point in time when the write signal WTS is generated and a point in time when data is written.

The latch circuit 424 included in the write enablement signal generation circuit 420 may generate the first write enablement signal WEN<1> which is disabled to have a logic "low" level by the reset signal RST having a logic "low" level and the write delay signal ENGIO having a logic "low" level.

The second receiver 23 may be inactivated by the first write enablement signal WEN<1>.

As described above, a semiconductor device according to an embodiment may activate only a transmitter or a receiver included in any one selected by a chip ID signal from a plurality of stacked slave chips to output or receive data during a read operation or a write operation. As a result, it may be possible to reduce power consumption of the semiconductor device.

What is claimed is:

1. A semiconductor device comprising:
    a master chip configured to output a write signal and chip identification (ID) signals and configured to output data through a transmitter activated by the write signal;
    a first slave chip configured to enter a write operation according to the write signal and configured to activate a first receiver to store the data when the chip ID signals have a first logic level combination; and
    wherein the master chip and the first slave chip are vertically stacked, and
    wherein the master chip and the first slave chip are electrically connected to each other by a plurality of through electrodes penetrating the first slave chip.

2. The semiconductor device of claim 1, further comprising:
    a second slave chip configured to enter the write operation according to the write signal and configured to activate a second receiver to store the data when the chip ID signals have a second logic level combination,
    wherein the master chip, the first slave chip, and the second slave chip are vertically stacked, and
    wherein the master chip, the first slave chip, and the second slave chip are electrically connected to each other by a plurality of through electrodes penetrating the master chip, the first slave chip, and the second slave chip.

3. The semiconductor device of claim 2, wherein any one of the first and second slave chips is selectively activated by the chip ID signals inputted through a single interconnection line comprised of some through electrodes vertically connected in series among the plurality of through electrodes, thereby allowing performance of the write operation.

4. The semiconductor device of claim 2, wherein any one of the first and second slave chips receives the data through a single interconnection line comprised of some through electrodes vertically connected in series among the plurality of through electrodes, thereby allowing performance of the write operation.

5. The semiconductor device of claim 1, wherein the master chip includes:
    an operation setup circuit configured to generate the write signal and the chip ID signals, configured to output the write signal via a first through electrode among the plurality of through electrodes, and configured to output the chip ID signals via a second through electrode among the plurality of through electrodes; and
    the transmitter configured to be activated by the write signal to output the data via a third through electrode among the plurality of through electrodes.

6. The semiconductor device of claim 5, wherein the operation setup circuit includes:
    a pulse generation circuit configured to generate a write pulse when the write signal is inputted to the pulse generation circuit;
    a drive circuit configured to generate a control signal which is enabled by the write pulse when an operation setup signal is enabled; and
    a chip ID generation circuit configured to output the chip ID signals via the second through electrode when the write signal is inputted to the chip ID generation circuit.

7. The semiconductor device of claim 6, wherein the drive circuit includes:
    a drive signal generation circuit configured to generate a drive signal which is enabled while both of the operation setup signal and the write signal are enabled;
    a first pull-up/pull-down signal generation circuit configured to generate a first pull-up signal and a first pull-down signal, one of which is selectively enabled according to a logic level of the write pulse while the write signal and the drive signal are enabled; and a first control signal output circuit configured to drive the control signal according to the first pull-up signal and the first pull-down signal to output the driven control signal via the first through electrode among the plurality of through electrodes.

8. The semiconductor device of claim 1, wherein the first slave chip further includes a first write control circuit configured to generate a first write enablement signal when the write signal and a control signal are enabled and each of the chip ID signals and a stored ID signals have the first logic level combination.

9. The semiconductor device of claim 8, wherein the first write control circuit includes:
a first comparison circuit configured to compare a logic level combination of the stored ID signals with a logic level combination of the chip ID signals to generate a first comparison signal while the write signal is enabled; and
a first write enablement signal generation circuit configured to generate the first write enablement signal from the first comparison signal while the control signal is enabled.

10. The semiconductor device of claim 9, wherein the first write enablement signal generation circuit includes:
a second pull-up/pull-down signal generation circuit configured to generate a second pull-up signal and a second pull-down signal, one of which is selectively enabled according to a logic level of the first comparison signal while the control signal is enabled;
a first pre-enablement signal generation circuit configured to generate a first pre-enablement signal according to the second pull-up signal and the second pull-down signal;
a first delay circuit configured to delay the write signal by a write latency period and configured to control a pulse width of the write signal to generate a first write delay signal; and
a first latch circuit configured to generate the first write enablement signal which is enabled by the first pre-enablement signal and which is disabled by the first write delay signal.

11. The semiconductor device of claim 2, wherein the second slave chip further includes a second write control circuit configured to generate a second write enablement signal when the write signal and a control signal are enabled and each of the chip ID signals and a stored ID signals have the second logic level combination.

12. The semiconductor device of claim 11, wherein the second write control circuit includes:
a second comparison circuit configured to compare a logic level combination of the stored ID signals with a logic level combination of the chip ID signals to generate a second comparison signal while the write signal is enabled; and
a second write enablement signal generation circuit configured to generate the second write enablement signal from the second comparison signal while the control signal is enabled.

13. The semiconductor device of claim 12, wherein the second write enablement signal generation circuit includes:
a third pull-up/pull-down signal generation circuit configured to generate a third pull-up signal and a third pull-down signal, one of which is selectively enabled according to a logic level of the second comparison signal while the control signal is enabled;
a second pre-enablement signal generation circuit configured to generate a second pre-enablement signal according to the third pull-up signal and the third pull-down signal;
a second delay circuit configured to delay the write signal by a write latency period and configured to control a pulse width of the write signal to generate a second write delay signal; and
a second latch circuit configured to generate the second write enablement signal which is enabled by the second pre-enablement signal and which is disabled by the second write delay signal.

14. A semiconductor device comprising:
a master chip configured to output a write signal, a read signal, and chip identification (ID) signals, configured to output first data through a first transmitter activated by the write signal, and configured to receive second data through a first receiver activated by the read signal;
a first slave chip configured to enter a write operation according to the write signal, configured to activate a second receiver to store the first data when the chip ID signals have a first logic level combination, configured to enter a read operation according to the read signal, and configured to activate a second transmitter to output the second data when the chip ID signals have the first logic level combination; and
a second slave chip configured to enter the write operation according to the write signal, configured to activate a third receiver to store the first data when the chip ID signals have a second logic level combination, configured to enter the read operation according to the read signal, and configured to activate a third transmitter to output the second data when the chip ID signals have the second logic level combination,
wherein the master chip, the first slave chip, and the second slave chip are vertically stacked, and
wherein the master chip, the first slave chip, and the second slave chip are electrically connected to each other by a plurality of through electrodes penetrating the master chip, the first slave chip, and the second slave chip.

15. The semiconductor device of claim 14, wherein any one of the first and second slave chips is selectively activated by the chip ID signals inputted through a single interconnection line comprised of some through electrodes vertically connected in series among the plurality of through electrodes, thereby performing the write operation or the read operation.

16. The semiconductor device of claim 14,
wherein any one of the first and second slave chips receives the first data through a single interconnection line comprised of some through electrodes vertically connected in series among the plurality of through electrodes, thereby allowing performance of the write operation; and
wherein any one of the first and second slave chips outputs the second data through a single interconnection line comprised of some through electrodes vertically connected in series among the plurality of through electrodes, thereby allowing performance of the read operation.

17. The semiconductor device of claim 14, wherein the master chip includes:
an operation setup circuit configured to generate the write signal, the read signal, and the chip ID signals, configured to output the write signal via a first through electrode among the plurality of through electrodes, configured to output the read signal via the first through electrode among the plurality of through electrodes, and configured to output the chip ID signals via a second through electrode among the plurality of through electrodes;

the first transmitter configured to be activated by the write signal to output the first data via a third through electrode among the plurality of through electrodes; and the first receiver configured to be activated by the read signal to receive the second data via the third through electrode.

18. The semiconductor device of claim 17, wherein the operation setup circuit includes:
   a write operation setup circuit configured to generate a control signal which is enabled when the write signal and an operation setup signal are inputted to the write operation setup circuit;
   a read operation setup circuit configured to generate the control signal which is enabled when the read signal and the operation setup signal are inputted to the read operation setup circuit; and
   a chip ID generation circuit configured to output the chip ID signals via the second through electrode when the write signal or the read signal is inputted to the chip ID generation circuit.

19. The semiconductor device of claim 18, wherein the write operation setup circuit includes:
   a first pulse generation circuit configured to generate a write pulse when the write signal is inputted to the first pulse generation circuit; and
   a first drive circuit configured to generate the control signal which is enabled by the write pulse when the operation setup signal is enabled.

20. The semiconductor device of claim 19, wherein the first drive circuit includes:
   a first drive signal generation circuit configured to generate a first drive signal which is enabled while both of the operation setup signal and the write signal are enabled;
   a first pull-up/pull-down signal generation circuit configured to generate a first pull-up signal and a first pull-down signal, one of which is selectively enabled according to a logic level of the write pulse while the write signal and the first drive signal are enabled; and
   a first control signal output circuit configured to drive the control signal according to the first pull-up signal and the first pull-down signal to output the driven control signal via the first through electrode among the plurality of through electrodes.

21. The semiconductor device of claim 18, wherein the read operation setup circuit includes:
   a second pulse generation circuit configured to generate a read pulse when the read signal is inputted to the second pulse generation circuit; and
   a second drive circuit configured to generate the control signal which is enabled by the read pulse when the operation setup signal is enabled.

22. The semiconductor device of claim 21, wherein the second drive circuit includes:
   a second drive signal generation circuit configured to generate a second drive signal which is enabled while both of the operation setup signal and the read signal are enabled;
   a second pull-up/pull-down signal generation circuit configured to generate a second pull-up signal and a second pull-down signal, one of which is selectively enabled according to a logic level of the read pulse while the read signal and the second drive signal are enabled; and
   a second control signal output circuit configured to drive the control signal according to the second pull-up signal and the second pull-down signal to output the driven control signal via the first through electrode among the plurality of through electrodes.

23. The semiconductor device of claim 14, wherein the first slave chip further includes a first input/output (I/O) control circuit configured to generate a first write enablement signal when the write signal and a control signal are enabled and the chip ID signals and a stored ID signals have the same logic level combination and configured to generate a first read enablement signal when the read signal and the control signal are enabled and the chip ID signals and the stored ID signals have the same logic level combination.

24. The semiconductor device of claim 23, wherein the first I/O control circuit includes:
   a first write control circuit configured to generate the first write enablement signal when the write signal and the control signal are enabled and each of the chip ID signals and a stored ID signals have the first logic level combination; and
   a first read control circuit configured to generate the first read enablement signal when the read signal and the control signal are enabled and each of the chip ID signals and the stored ID signals have the first logic level combination.

25. The semiconductor device of claim 24, wherein the first write control circuit includes:
   a first comparison circuit configured to compare a logic level combination of the stored ID signals with a logic level combination of the chip ID signals to generate a first comparison signal while the write signal is enabled; and
   a first write enablement signal generation circuit configured to generate the first write enablement signal from the first comparison signal while the control signal is enabled.

26. The semiconductor device of claim 25, wherein the first write enablement signal generation circuit includes:
   a third pull-up/pull-down signal generation circuit configured to generate a third pull-up signal and a third pull-down signal, one of which is selectively enabled according to a logic level of the first comparison signal while the control signal is enabled;
   a first pre-enablement signal generation circuit configured to generate a first pre-enablement signal according to the third pull-up signal and the third pull-down signal;
   a first delay circuit configured to delay the write signal by a write latency period and configured to control a pulse width of the write signal to generate a first write delay signal; and
   a first latch circuit configured to generate the first write enablement signal which is enabled by the first pre-enablement signal and which is disabled by the first write delay signal.

27. The semiconductor device of claim 24, wherein the first read control circuit includes:
   a second comparison circuit configured to compare a logic level combination of the stored ID signals with a logic level combination of the chip ID signals to generate a second comparison signal while the read signal is enabled; and a first read enablement signal generation circuit configured to generate the first read enablement signal from the second comparison signal while the control signal is enabled.

28. The semiconductor device of claim 27, wherein the first read enablement signal generation circuit includes:
   a fourth pull-up/pull-down signal generation circuit configured to generate a fourth pull-up signal and a fourth pull-down signal, one of which is selectively enabled according to a logic level of the second comparison signal while the control signal is enabled;
   a second pre-enablement signal generation circuit configured to generate a second pre-enablement signal according to the fourth pull-up signal and the fourth pull-down signal;
   a second delay circuit configured to delay the read signal by a read latency period and configured to control a pulse width of the read signal to generate a first read delay signal; and
   a second latch circuit configured to generate the first read enablement signal which is enabled by the second pre-enablement signal and which is disabled by the first read delay signal.

29. The semiconductor device of claim 14, wherein the second slave chip further includes a second I/O control circuit configured to generate a second write enablement signal when the write signal and a control signal are enabled and the chip ID signals and a stored ID signals have the same logic level combination and configured to generate a second read enablement signal when the read signal and the control signal are enabled and the chip ID signals and the stored ID signals have the same logic level combination.

30. The semiconductor device of claim 29, wherein the second I/O control circuit includes:
   a second write control circuit configured to generate the second write enablement signal when the write signal and the control signal are enabled and each of the chip ID signals and a stored ID signals have the second logic level combination; and
   a second read control circuit configured to generate the second read enablement signal when the read signal and the control signal are enabled and each of the chip ID signals and the stored ID signals have the second logic level combination.

31. The semiconductor device of claim 24, wherein the second write control circuit includes:
   a third comparison circuit configured to compare a logic level combination of the stored ID signals with a logic level combination of the chip ID signals to generate a third comparison signal while the write signal is enabled; and
   a second write enablement signal generation circuit configured to generate the second write enablement signal from the third comparison signal while the control signal is enabled.

32. The semiconductor device of claim 31, wherein the second write enablement signal generation circuit includes:
   a fifth pull-up/pull-down signal generation circuit configured to generate a fifth pull-up signal and a fifth pull-down signal, one of which is selectively enabled according to a logic level of the third comparison signal while the control signal is enabled;
   a third pre-enablement signal generation circuit configured to generate a third pre-enablement signal according to the fifth pull-up signal and the fifth pull-down signal;
   a third delay circuit configured to delay the write signal by a write latency period and configured to control a pulse width of the write signal to generate a second write delay signal; and
   a third latch circuit configured to generate the second write enablement signal which is enabled by the third pre-enablement signal and which is disabled by the second write delay signal.

33. The semiconductor device of claim 30, wherein the second read control circuit includes:
   a fourth comparison circuit configured to compare a logic level combination of the stored ID signals with a logic level combination of the chip ID signals to generate a fourth comparison signal while the read signal is enabled; and
   a second read enablement signal generation circuit configured to generate the second read enablement signal from the fourth comparison signal while the control signal is enabled.

34. The semiconductor device of claim 33, wherein the second read enablement signal generation circuit includes:
   a sixth pull-up/pull-down signal generation circuit configured to generate a sixth pull-up signal and a sixth pull-down signal, one of which is selectively enabled according to a logic level of the fourth comparison signal while the control signal is enabled;
   a fourth pre-enablement signal generation circuit configured to generate a fourth pre-enablement signal according to the sixth pull-up signal and the sixth pull-down signal;
   a fourth delay circuit configured to delay the read signal by a read latency period and configured to control a pulse width of the read signal to generate a second read delay signal; and
   a fourth latch circuit configured to generate the second read enablement signal which is enabled by the fourth pre-enablement signal and which is disabled by the second read delay signal.

35. A semiconductor device comprising:
   a master chip configured to output a read signal and chip identification (ID) signals and configured to receive data through a receiver activated by the read signal;
   a first slave chip configured to enter a read operation according to the read signal and configured to activate a first transmitter to output the data when the chip ID signals have a first logic level combination; and
   wherein the master chip and the first slave chip are vertically stacked, and wherein the master chip and the first slave chip are electrically connected to each other by a plurality of through electrodes penetrating the master chip and the first slave chip.

* * * * *